US008199505B2

(12) United States Patent
Dede

(10) Patent No.: US 8,199,505 B2
(45) Date of Patent: Jun. 12, 2012

(54) JET IMPINGEMENT HEAT EXCHANGER APPARATUSES AND POWER ELECTRONICS MODULES

(75) Inventor: Ercan Mehmet Dede, Ann Arbor, MI (US)

(73) Assignee: Toyota Motor Engineering & Manufacturing Norh America, Inc., Erlanger, KY (US)

( * ) Notice: Subject to any disclaimer, the term of this patent is extended or adjusted under 35 U.S.C. 154(b) by 100 days.

(21) Appl. No.: 12/880,386

(22) Filed: Sep. 13, 2010

(65) Prior Publication Data

US 2012/0063085 A1    Mar. 15, 2012

(51) Int. Cl.
*H05K 7/20* (2006.01)

(52) U.S. Cl. ............ 361/702; 361/679.53; 361/679.54; 361/699; 361/703; 361/704; 361/718; 165/104.33; 165/185; 165/908; 363/141

(58) Field of Classification Search ............ 361/679.53–679.54, 689, 699, 702–704, 709–710, 715, 361/717–718, 722; 165/80.4, 104.33, 185, 165/908; 363/141
See application file for complete search history.

(56) References Cited

U.S. PATENT DOCUMENTS

| | | | |
|---|---|---|---|
| 4,322,737 A | 3/1982 | Sliwa, Jr. |
| 4,392,153 A | 7/1983 | Glascock, II et al. |
| 4,494,171 A | 1/1985 | Bland et al. |
| 4,733,293 A | 3/1988 | Gabuzda |
| 4,748,495 A | 5/1988 | Kucharek |
| 4,783,721 A | 11/1988 | Yamamoto et al. |
| 4,868,712 A | 9/1989 | Woodman |
| 4,920,574 A | 4/1990 | Yamamoto et al. |
| 5,016,138 A | 5/1991 | Woodman |
| 5,023,695 A | 6/1991 | Umezawa et al. |
| 5,079,619 A | 1/1992 | Davidson |
| 5,088,005 A | 2/1992 | Ciaccio |
| 5,119,175 A | 6/1992 | Long et al. |
| 5,145,001 A | 9/1992 | Valenzuela |
| 5,210,440 A | 5/1993 | Long |
| 5,228,502 A | 7/1993 | Chu et al. |
| 5,260,850 A | 11/1993 | Sherwood et al. |
| 5,269,372 A | 12/1993 | Chu et al. |
| 5,270,572 A | 12/1993 | Nakajima et al. |

(Continued)

OTHER PUBLICATIONS

U.S. Appl. No. 12/839,039, filed Jul. 19, 2010, titled: Heat Exchanger Fluid Distribution Manifolds and Power Electronics Modules Incorporating the Same.

*Primary Examiner* — Robert J Hoffberg
(74) *Attorney, Agent, or Firm* — Dinsmore & Shohl LLP

(57) ABSTRACT

A jet impingement heat exchanger includes an inlet jet, a target layer, a second layer, a transition channel, and a fluid outlet. The target layer includes an impingement region and a plurality of target layer microchannels that radially extend from the impingement region. The jet of coolant fluid impinges the target layer at the impingement region and flows through the radially-extending target layer microchannels toward a perimeter of the target layer. The second layer includes a plurality of radially-extending second layer microchannels. The transition channel is positioned between the target layer and the second layer to fluidly couple the second layer to the target layer. The coolant fluid flows through the transition channel and the plurality of radially-extending second layer microchannels. The fluid outlet fluidly is coupled to the second layer. Jet impingement exchangers may be incorporated into a power electronics module having a power electronics device.

19 Claims, 3 Drawing Sheets

U.S. PATENT DOCUMENTS

| | | | |
|---|---|---|---|
| 5,365,400 A * | 11/1994 | Ashiwake et al. | 361/752 |
| 5,394,299 A | 2/1995 | Chu et al. | |
| 5,546,274 A | 8/1996 | Davidson | |
| 5,912,800 A | 6/1999 | Sammakia et al. | |
| 5,983,997 A | 11/1999 | Hou | |
| 6,058,010 A | 5/2000 | Schmidt et al. | |
| 6,167,948 B1 | 1/2001 | Thomas | |
| 6,242,075 B1 | 6/2001 | Chao et al. | |
| 6,305,463 B1 | 10/2001 | Salmonson | |
| 6,333,853 B2 | 12/2001 | O'Leary et al. | |
| 6,431,260 B1 | 8/2002 | Agonafer et al. | |
| 6,501,654 B2 | 12/2002 | O'Connor et al. | |
| 6,580,609 B2 | 6/2003 | Pautsch | |
| 6,665,185 B1 | 12/2003 | Kulik et al. | |
| 6,828,675 B2 | 12/2004 | Memory et al. | |
| 6,903,931 B2 | 6/2005 | McCordic et al. | |
| 6,942,018 B2 | 9/2005 | Goodson et al. | |
| 6,952,346 B2 | 10/2005 | Tilton et al. | |
| 6,972,365 B2 | 12/2005 | Garner | |
| 6,986,382 B2 | 1/2006 | Upadhya et al. | |
| 6,988,535 B2 | 1/2006 | Upadhya et al. | |
| 6,992,382 B2 | 1/2006 | Chrysler et al. | |
| 6,994,151 B2 | 2/2006 | Zhou et al. | |
| 7,017,654 B2 | 3/2006 | Kenny et al. | |
| 7,058,101 B2 | 6/2006 | Treusch et al. | |
| 7,071,408 B2 | 7/2006 | Garner | |
| 7,104,312 B2 | 9/2006 | Goodson et al. | |
| 7,119,284 B2 | 10/2006 | Bel et al. | |
| 7,184,269 B2 | 2/2007 | Campbell et al. | |
| 7,188,662 B2 | 3/2007 | Brewer et al. | |
| 7,204,303 B2 | 4/2007 | Thomas et al. | |
| 7,205,653 B2 | 4/2007 | Brandenburg et al. | |
| 7,212,409 B1 | 5/2007 | Belady et | |
| 7,250,674 B2 | 7/2007 | Inoue | |
| 7,295,440 B2 | 11/2007 | Ganev et al. | |
| 7,298,617 B2 | 11/2007 | Campbell et al. | |
| 7,298,618 B2 | 11/2007 | Campbell et al. | |
| 7,302,998 B2 | 12/2007 | Valenzuela | |
| 7,327,570 B2 | 2/2008 | Belady | |
| 7,336,493 B2 | 2/2008 | Berkenbush et al. | |
| 7,355,277 B2 | 4/2008 | Myers et al. | |
| 7,365,981 B2 | 4/2008 | Myers et al. | |
| 7,385,817 B2 | 6/2008 | Campbell et al. | |
| 7,393,226 B2 | 7/2008 | Clayton et al. | |
| 7,397,662 B2 | 7/2008 | Oyamada | |
| 7,400,504 B2 | 7/2008 | Campbell et al. | |
| 7,414,844 B2 | 8/2008 | Wilson et al. | |
| 7,429,792 B2 | 9/2008 | Lee et al. | |
| 7,435,623 B2 | 10/2008 | Chrysler et al. | |
| 7,450,378 B2 | 11/2008 | Nelson et al. | |
| 7,486,514 B2 | 2/2009 | Campbell et al. | |
| 7,495,916 B2 | 2/2009 | Shiao et al. | |
| 7,551,439 B2 | 6/2009 | Peugh et al. | |
| 7,599,184 B2 | 10/2009 | Upadhya et al. | |
| 7,608,924 B2 | 10/2009 | Myers et al. | |
| 7,679,911 B2 | 3/2010 | Rapp | |
| 7,738,249 B2 | 6/2010 | Chan et al. | |
| 7,795,726 B2 | 9/2010 | Myers et al. | |
| 7,808,780 B2 | 10/2010 | Brunschwiler et al. | |
| 7,830,664 B2 | 11/2010 | Campbell et al. | |
| 7,839,642 B2 | 11/2010 | Martin | |
| 8,037,927 B2 * | 10/2011 | Schuette | 165/104.26 |
| 8,077,460 B1 * | 12/2011 | Dede et al. | 361/699 |
| 2002/0053726 A1 | 5/2002 | Mikubo et al. | |
| 2003/0196451 A1 | 10/2003 | Goldman et al. | |
| 2005/0121180 A1 | 6/2005 | Marsala | |
| 2005/0199372 A1 | 9/2005 | Frazer et al. | |
| 2005/0225938 A1 | 10/2005 | Montgomery et al. | |
| 2006/0002086 A1 | 1/2006 | Teneketges et al. | |
| 2006/0291164 A1 | 12/2006 | Myers et al. | |
| 2007/0034360 A1 | 2/2007 | Hall | |
| 2007/0041160 A1 | 2/2007 | Kehret et al. | |
| 2007/0074856 A1 | 4/2007 | Bhatti et al. | |
| 2007/0114656 A1 | 5/2007 | Brandenburg et al. | |
| 2007/0119565 A1 | 5/2007 | Brunschwiler et al. | |
| 2007/0177352 A1 | 8/2007 | Monfarad et al. | |
| 2007/0188991 A1 | 8/2007 | Wilson et al. | |
| 2007/0230127 A1 | 10/2007 | Peugh et al. | |
| 2007/0236883 A1 | 10/2007 | Ruiz | |
| 2008/0093053 A1 | 4/2008 | Song et al. | |
| 2008/0245506 A1 | 10/2008 | Campbell et al. | |
| 2009/0032937 A1 | 2/2009 | Mann et al. | |
| 2009/0090490 A1 | 4/2009 | Yoshida et al. | |
| 2009/0108439 A1 | 4/2009 | Brandenburg et al. | |
| 2009/0294106 A1 | 12/2009 | Flotta et al. | |
| 2010/0000766 A1 | 1/2010 | Loiselet et al. | |
| 2010/0038774 A1 | 2/2010 | Zhang et al. | |
| 2010/0142150 A1 | 6/2010 | Campbell et al. | |
| 2010/0242178 A1 | 9/2010 | Goetting | |
| 2010/0246117 A1 | 9/2010 | Brunschwiler et al. | |
| 2011/0299244 A1 * | 12/2011 | Dede et al. | 361/689 |

* cited by examiner

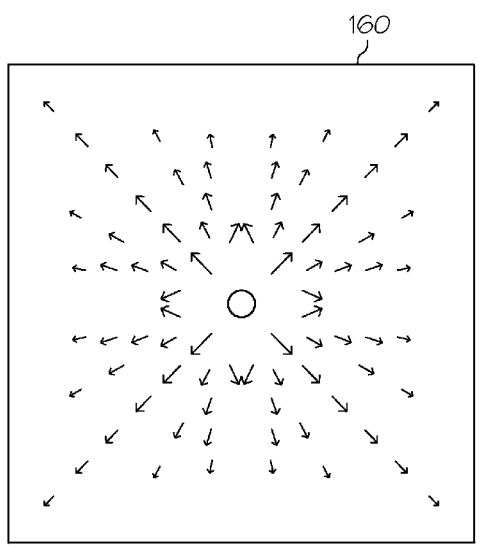
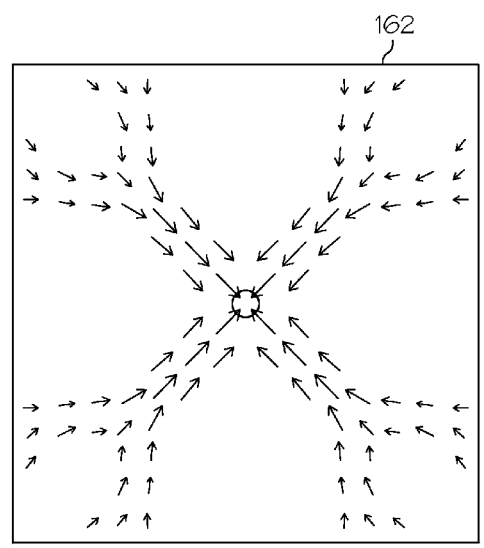
FIG. 3A
FIG. 3B

JET IMPINGEMENT HEAT EXCHANGER APPARATUSES AND POWER ELECTRONICS MODULES

TECHNICAL FIELD

The present specification generally relates to apparatuses for cooling heat generating devices such as power electronic devices and, more specifically, to jet impingement heat exchangers and power electronics modules utilizing multiple-pass fluid flows through a plurality of radially extending microchannels.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer, and remove such heat from the heat generating device. For example, a jet of cooling fluid may be directed such that it impinges a surface of the heat generating device. Another way to remove heat from a heat generating device is to couple the device to a finned heat sink made of a thermally conductive material, such as aluminum.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels.

Accordingly, a need exists for alternative jet impingement heat exchangers and methods to cool heat generating devices.

SUMMARY

In one embodiment, a jet impingement heat exchanger includes an inlet jet, a target layer, a second layer, a transition channel, and a fluid outlet. The inlet jet is operable to produce a jet of coolant fluid. The target layer includes an impingement region and a plurality of target layer microchannels. The target layer microchannels radially extend from the impingement region. The jet of coolant fluid impinges the target layer at the impingement region and flows through the radially-extending target layer microchannels toward a perimeter of the target layer. The second layer includes a plurality of radially-extending second layer microchannels. The transition channel is positioned between the target layer and the second layer such that the transition channel fluidly couples the second layer to the target layer, and the coolant fluid flows through the transition channel and the plurality of radially-extending second layer microchannels. The fluid outlet fluidly is coupled to the second layer such that the coolant fluid flows from the plurality of radially-extending second layer microchannels though the fluid outlet.

In another embodiment, a power electronics module includes a jet impingement heat exchanger, a substrate layer, and a power electronics device. The jet impingement heat exchanger includes an inlet jet, a target layer, a second layer, a transition channel, and a fluid outlet. The inlet jet is operable to produce a jet of coolant fluid. The target layer includes an impingement region and a plurality of target layer microchannels. The target layer microchannels radially extend from the impingement region. The jet of coolant fluid impinges the target layer at the impingement region and flows through the radially-extending target layer microchannels toward a perimeter of the target layer. The second layer includes a plurality of radially-extending second layer microchannels. The transition channel is positioned between the target layer and the second layer such that the transition channel fluidly couples the second layer to the target layer, and the coolant fluid flows through the transition channel and the plurality of radially-extending second layer microchannels. The fluid outlet fluidly is coupled to the second layer such that the coolant fluid flows from the plurality of radially-extending second layer microchannels though the fluid outlet. The substrate layer is coupled to a backside of the target layer, and the power electronics device is coupled to the substrate layer. Heat generated by the power electronics device is transferred to the coolant fluid within the jet impingement heat exchanger at least through the substrate layer and the target layer.

In yet another embodiment, a jet impingement heat exchanger includes an inlet jet, a target layer, a second layer, a transition channel, and a fluid outlet plate having a fluid outlet. The inlet jet is operable to produce a jet of a coolant fluid. The target layer includes an impingement region and a plurality of target layer microchannels that radially extend from the impingement region. The jet of coolant fluid impinges the target layer at the impingement region and the coolant fluid flows through the radially-extending target layer microchannels toward a perimeter of the target layer. The second layer includes a plurality of radially-extending second layer microchannels, wherein the inlet jet is integral with the second layer. The transition channel is positioned between the target layer and the second layer at a perimeter of the jet impingement heat exchanger, and is normal to the target layer microchannels and second layer microchannels. The transition channel fluidly couples the second layer to the target layer such that the coolant fluid flows through the transition channel and the plurality of radially-extending second layer microchannels. The fluid outlet plate is coupled to the second layer, and the fluid outlet is concentric with the inlet jet. The fluid outlet is fluidly coupled to the second layer such that the coolant fluid flows from the plurality of radially-extending second layer microchannels though the fluid outlet.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 3A depicts a schematic illustration of coolant fluid flow in the target layer of the jet impingement heat exchanger illustrated in FIG. 1; and FIG. 3B depicts a schematic illustration of coolant fluid flow in the second layer of the jet impingement heat exchanger illustrated in FIG. 1.

DETAILED DESCRIPTION

Figure 1:
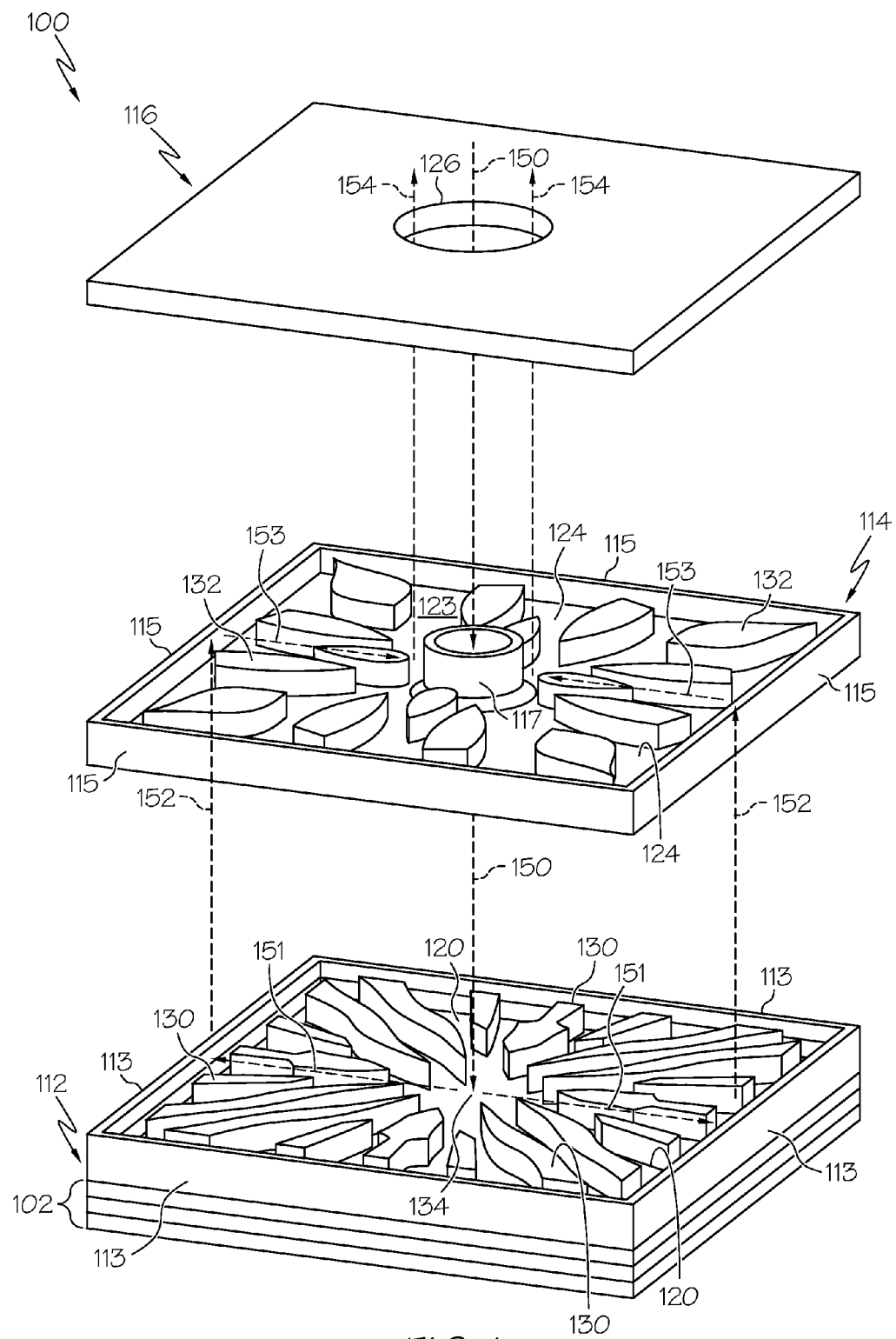
FIG. 1 depicts a perspective exploded view of a jet impingement heat exchanger according to one or more embodiments shown and described herein.

FIG. 1 generally depicts one embodiment of a jet impingement heat exchanger. The jet impingement heat exchanger generally comprises an inlet jet, a target layer, a second layer, a transition channel, and a fluid outlet. The target layer has an impingement region that is configured to receive a jet of coolant fluid via the inlet jet as well as a plurality of target layer microchannels that optimally route the coolant fluid from the impingement region to a perimeter of the target layer. The transition channel fluidly couples the target layer to the second layer. The coolant fluid flows through the transition channel and into a plurality of second layer microchannels. The second layer microchannels optimally direct the coolant fluid toward the fluid outlet, where the coolant fluid then exits the jet impingement heat exchanger. The two layers of the jet impingement heat exchanger enable a multi-pass heat exchanger in which the coolant fluid travels in two directions over the surface heated by a heat generating device. The multi-pass feature provides for enhanced cooling as the coolant fluid is in contact with more surface area and experiences fluid mixing at the transition channel. Embodiments combine features of an impingement jet structure and a channel-based structure to create multi-layered heat exchanger structures for single- or double-sided cooling. Various embodiments of jet impingement heat exchangers, power electronics modules and operations thereof will be described in more detail herein.

Figure 2:
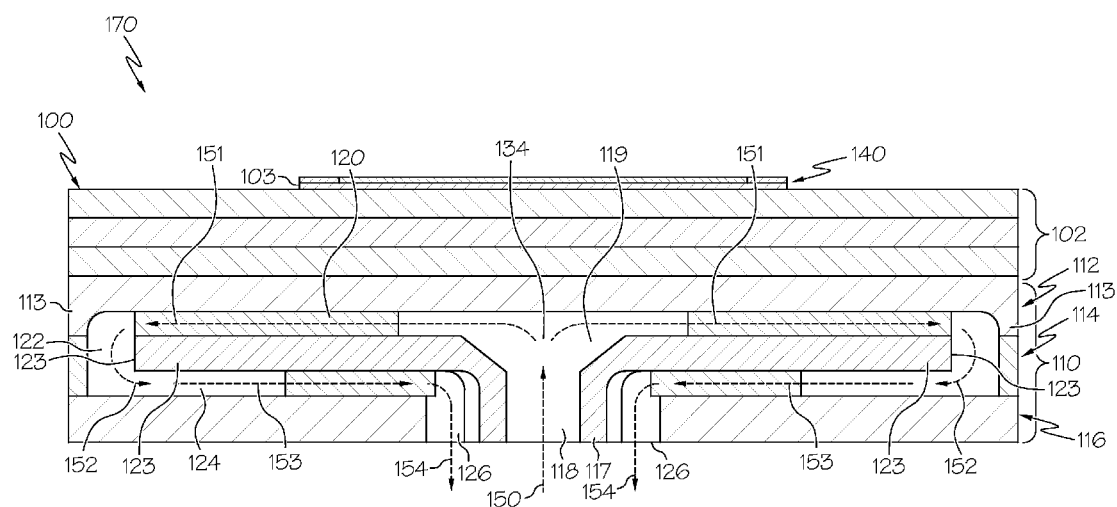
FIG. 2 depicts a cross section view of a power electronics device, substrate layer and jet impingement heat exchanger according to one or more embodiments shown and described herein.

Referring now to FIGS. 1 and 2, an exemplary jet impingement heat exchanger 100 and a power electronics module 170 utilizing a jet impingement heat exchanger 100 are illustrated, respectively. FIG. 1 is an exploded view of one embodiment of a jet impingement heat exchanger 100 and FIG. 2 is a cross section view of a power electronics module 170 including a jet impingement heat exchanger 100. As used herein, the term power electronics module generally denotes a jet impingement heat exchanger having one or more heat generating devices 140 (e.g., a power electronics device) coupled thereto. The jet impingement heat exchanger 100 illustrated in FIG. 1 generally comprises an inlet jet 117, a target layer 112, a second layer 114, and a fluid outlet 126. As described in more detail below, the coolant fluid may be introduced into the jet impingement heat exchanger 100 to reduce the operating temperature of a power electronics device.

In one embodiment, the inlet jet 117 may be integrally formed as a cylinder within the second layer 114. The inlet jet 117 may take a variety of configurations and it should be understood that it is not limited to the configuration illustrated in FIG. 1. In another embodiment, the inlet jet 117 may be a separate component from the second layer 114. For example, the inlet jet 117 may be configured as a nozzle that is fitted into an opening of the second layer 114. The inlet jet 117 may be made of a thermally conductive material to aid in the transfer of thermal energy generated by the heat generating device 140 (see FIG. 2).

Coolant fluid may be introduced into the inlet jet 117 as illustrated by arrow 150. A coolant fluid line (not shown) may be fluidly coupled to the inlet jet 117 (e.g., via fluid couplings) to provide the coolant fluid to the inlet jet 117. The coolant fluid line may be connected to a coolant fluid source (not shown), such as a radiator of a vehicle or other similar coolant fluid reservoir. The coolant fluid may be any type of fluid used for heat exchanging applications, such as radiator fluid and water, for example.

The target layer 112 comprises an impingement region 134, target layer walls 113, and a plurality of radially-extending target layer microchannels 120. The impingement region 134 is the portion of the target layer that the jet of coolant fluid strikes. After impinging the impingement region 134, the coolant fluid flows outwardly through the target layer microchannels 120 toward the target layer walls 113 as indicated by arrows 151. The target layer walls 113 maintain the coolant fluid within the target layer 112. Referring to FIG. 3A, a target layer coolant fluid flow pattern 160 is illustrated. The coolant fluid flows from the center of the target layer 112 to the perimeter.

As illustrated in FIG. 1, the radially-extending target layer microchannels 120 are defined by a plurality of target layer features 130 of different shapes and sizes. The target layer features 130 have curved walls and are geometrically optimized to reduce pressure drop, enhance heat transfer, and direct the coolant fluid toward the perimeter of the target layer 112. The term optimized as used herein means that the geometrical configuration of the features and resulting microchannels are designed to enhance fluid flow, reduce pressure drop, and increase heat transfer to the coolant fluid. In other words, the microchannels are not simply straight channels, and the features defining the microchannels have curved walls and vary in size and shape. By selecting the geometrical configuration of the target layer features 130, the coolant fluid may more efficiently flow within the target layer microchannels 120. Curved walls also increase the surface area in which the coolant fluid is in contact with the target layer 112, thereby increasing thermal transfer from the target layer 112 to the coolant fluid. The geometric configuration of the target layer features 130 and resulting target layer microchannels 120 positioned therebetween may be determined by computer simulation, for example. The geometric configuration utilized for the target layer microchannels 120 may depend on parameters such as flow resistance, the type of coolant fluid, and the desired maximum operating temperature of the power electronics device, for example.

The target layer 112 may be made of a thermally conductive material that allows for the transfer of thermal energy from the target layer 112 to the coolant fluid. Exemplary materials include, but are not limited to, copper, aluminum, thermally enhanced composite materials, and polymer composite materials. The target layer 112 and corresponding components may be formed by a molding process, machining process or similar processes to achieve the desired shape and configuration.

Coupled to the target layer 112 is a second layer 114 that enables a second coolant fluid pass within the jet impingement heat exchanger 100. The second layer 114 may be coupled to the target layer 112 at an interface between the target layer walls 113 and second layer walls 115 by any appropriate coupling method. For example, the second layer 114 may be thermally coupled to the target layer 112 by a brazing process in which a thin metal alloy is used to form a braze between the two structures. A solder bond may also be utilized. Diffusion bonding may also be used to couple the second layer 114 to the target layer 112. The method chosen to couple the second layer 114 to the target layer 112 should ensure that the two layers are sealed and the coolant fluid remains within the jet impingement heat exchanger 100. Sealants and/or an overmolding may also be used.

Referring to FIG. 2, a transition channel 122 is located between the second layer 114 and the target layer 112. The transition channel 122 is located around the perimeter of the jet impingement heat exchanger 100 and may be formed by one or more gaps between a bottom surface 123 of the second layer 114 and the second layer walls 115. This gap enables coolant fluid to flow from the target layer 112 to the second layer 114, as indicated by arrows 152. The flow of the coolant fluid within the transition channel 122 is normal to the flow of the coolant fluid in the target layer 112.

The coolant fluid flows through the transition channel 122 and turns 180 degrees from the direction of flow within the target layer microchannels 120 as it flows in the second layer 114. As illustrated in FIG. 1, the second layer 114 comprises a plurality of radially-extending second layer microchannels 124 that are defined by a plurality of second layer features 132. The coolant fluid flows from the perimeter of the second layer 114 (near the second layer walls 115) through the second layer microchannels 124 and toward the center of the second layer 114. As described above with respect to the target layer microchannels 120 and target layer features 130, the second layer microchannels 124 and second layer features 132 have different geometric shapes and sizes.

The second layer features 132 have curved walls and are geometrically optimized to reduce pressure drop, enhance heat transfer, and efficiently direct the coolant fluid toward the center of the second layer 114 as indicated by arrows 153. By manipulating the geometrical configuration of the second layer features 132, the coolant fluid may more efficiently flow within the second layer microchannels 124. As stated above with respect to the target layer features 130, the curved walls of the second layer features 132 also increase the surface area in which the coolant fluid is in contact with the second layer 114, thereby increasing thermal transfer from the second layer 114 to the coolant fluid. The geometric configuration of the second layer features 132 and resulting second layer microchannels 124 therebetween may also be determined by computer simulation. The geometric configuration utilized for the second layer microchannels 124 may depend on parameters such as flow resistance, type of coolant fluid, and the desired maximum operating temperature of the power electronics device, for example.

FIG. 3B illustrates a second layer coolant fluid flow pattern 162. It is noted that the pattern defined by the target layer microchannels 120 is different from the pattern defined by the second layer microchannels 124. The different patterns result from the difference in direction of fluid flow within the two layers. In the target layer 112, the coolant fluid flows from the center to the perimeter of the target layer 112. In the second layer 114, the coolant fluid flows from the perimeter to the center of the second layer 114. It is also noted that the second layer features 132 differ in size and geometric configuration than those of the target layer features 130. It should be understood that target layer microchannel patterns and second layer microchannel patterns other than those illustrated in FIG. 1 may be utilized.

The second layer 114 may also be made of a thermal conductive material that allows for the transfer of thermal energy from the target layer 112 to the coolant fluid. As described above with respect to the target layer 112, exemplary materials include, but are not limited to, copper, aluminum, thermally enhanced composite materials, and polymer composite materials. The second layer 114 and corresponding components may also be formed by a molding process, a machining process or similar processes to achieve the desired shape and configuration.

Referring once again to FIG. 1, a fluid outlet 126 is provided to enable the exit of warmed coolant fluid from the jet impingement heat exchanger 100. The coolant fluid may exit normally to the heat transfer surfaces of the target layer 112 and second layer 114. In the illustrated embodiment, the fluid outlet 126 is configured as an opening within a fluid outlet plate 116 that is coupled to the second layer 114. The fluid outlet plate 116 may be thermally coupled to the second layer 114 via the brazing, soldering, and diffusion bonding coupling methods (or other methods) described above with respect to coupling the second layer 114 to the target layer 112. The fluid outlet plate 116 may also be made of a thermally conductive material.

Although the fluid outlet 126 is illustrated as a circular opening within the fluid outlet plate 116, other configurations are possible. For example, fluid coupler devices (not shown) may be provided at the fluid outlet that are configured to mate with a fluid line (not shown) that redirects the warmed coolant fluid back to the coolant fluid reservoir (not shown), where it may be chilled and re-circulated back to the jet impingement heat exchanger 100 and/or other systems.

As shown in FIGS. 1 and 2, the fluid outlet 126 may be concentric with the jet inlet 117 to minimize space requirements and to make for a more compact device. Use of a fluid outlet 126 that is concentric with the jet inlet 117 also enables a symmetric flow of coolant fluid within the target and second layers 112, 114.

Referring specifically now to FIG. 2, a power electronics module 170 comprising a power electronics device 140 and a jet impingement heat exchanger 100 is illustrated. The jet impingement heat exchanger 100 may be used to remove heat flux generated by the power electronics device 140 during its operation. The power electronics device 140 may be one or more semiconductor devices that may include, without limitation, IGBTs, RC-IGBTs, MOSFETs, power MOSFETs, diodes, transistors, and/or combinations thereof (e.g., power cards). As an example, the power electronics device or devices 140 may be used in a vehicular electrical system, such as in hybrid-electric or electric vehicles (e.g., an inverter system). Such power electronics devices may generate significant heat flux when propelling a vehicle. It should be understood that the jet impingement heat exchangers described herein may also be utilized in other applications and are not limited to vehicular applications.

The jet impingement heat exchanger 100 may further comprise a substrate layer 102 to which the power electronics device 140 may be coupled. The substrate layer 102 may be a thermally conductive layer that aids in transferring the thermal energy generated by the power electronics device 140 to the target layer 112 and second layer 114 of the jet impingement heat exchanger 100. The substrate layer 102 may comprise a direct bonded aluminum substrate, a direct bonded copper substrate, or other similar substrate layer.

The power electronics device 140 may be coupled to the substrate layer 102 using any appropriate coupling method. In one embodiment, a bond layer 103 is used to couple the power electronics device 140 to the substrate layer 102/jet impingement heat exchanger 100. As examples and not limitations, the bond layer may comprise a solder layer, a nano-silver sinter layer, or a transient-liquid-phase layer.

In one embodiment, an additional jet impingement heat exchanger may also be coupled to the power electronics device by the coupling methods described above such that power electronics module comprises a double-sided cooling structure. A first jet impingement heat exchanger may be coupled to a first side of the power electronics device (e.g., a top surface), and an additional jet impingement heat exchanger may be coupled to a second side of the power electronics device (e.g., a bottom surface).

Operation of the jet impingement heat exchanger 100 will now be described with general reference to FIG. 2. Heat flux generated by the power electronics device 140 is transferred to the jet impingement heat exchanger 100 through the substrate layer 102, target layer 112, and second layer 114. A jet of coolant fluid (illustrated by arrow 150) is introduced into the jet impingement heat exchanger 100 via the inlet jet. The jet of coolant fluid impinges the target layer 112 at an impingement region 134. Heat flux is transferred from the power electronics device 140 to the coolant fluid at the impingement region 134. Preferably, the impingement region 134 is centered on a local hot spot of the power electronics device 140 such that this area of the power electronics device 140 receives the impingement of coolant fluid.

The coolant fluid then changes direction to a flow direction that is normal to the jet of coolant fluid 150. The coolant fluid flows radially toward the perimeter of the target layer 112 through the radially-extending target layer microchannels 120, as indicated by arrows 151. Therefore, the coolant fluid flows over the surface of the target layer 112 and is in contact with the various target layer features 130 to conductively transfer heat flux from the target layer 112 to the coolant fluid.

The coolant fluid then reaches the target layer walls 113 where it is then forced into the transition channel 122. The coolant fluid changes direction and flows within the transition channel 122 such that it flows normal to the flow within the target layer 112. The coolant fluid flow within the transition channel 122 is illustrated by arrows 152. Enhanced thermal mixing occurs within the transition channel, which further increases heat transfer by convection.

After flowing into and out of the transition channel 122, the coolant fluid then is forced into the second layer 114 where it flows in a direction that is 180 degrees from the flow direction in the target layer 112. The coolant fluid flows from the perimeter toward the center of the jet impingement heat exchanger 100 as indicated by arrows 153. The coolant fluid therefore makes a second pass over the heat transfer surface through the second layer microchannels 124, and continues to receive heat flux from the power electronics device 140. After exiting the second layer microchannels 124, the coolant fluid exits the jet impingement heat exchanger 100 through the concentric fluid outlet as indicated by arrows 154. The warmed coolant fluid that exits the jet impingement heat exchanger 100 may be cooled in a secondary recirculation loop, such as an automotive radiator, for example.

It should now be understood that the embodiments of the multi-pass jet impingement heat exchangers and power electronics modules described herein may be utilized to remove heat generated by a heat generating device, such as a semiconductor device, by conductive and convective heat transfer. The jet impingement heat exchangers may have a plurality of target layer microchannels and second layer microchannels through which coolant fluid may circulate in a multi-pass flow pattern. Heat produced by the heat generating device may be removed by conductive and convective transfer by normal jet impingement on the target layer, the geometrically optimized features (target layer and second layer features), enhanced fluid mixing at transition channels, and optimized microchannels for greater surface area and an enlarged heat transfer path.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A jet impingement heat exchanger comprising:
   an inlet jet operable to produce a jet of a coolant fluid;
   a target layer comprising an impingement region and a plurality of target layer microchannels, wherein the target layer microchannels radially extend from the impingement region, the jet of the coolant fluid impinges the target layer at the impingement region, and the coolant fluid flows through the radially-extending target layer microchannels toward a perimeter of the target layer;
   a second layer comprising a plurality of radially-extending second layer microchannels;
   a transition channel positioned between the target layer and the second layer, wherein the transition channel fluidly couples the second layer to the target layer, and the coolant fluid flows through the transition channel and the plurality of radially-extending second layer microchannels; and
   a fluid outlet fluidly coupled to the second layer, wherein the coolant fluid flows from the plurality of radially-extending second layer microchannels though the fluid outlet.

2. The jet impingement heat exchanger of claim 1, wherein the inlet jet is substantially cylindrical and is integral with the second layer.

3. The jet impingement heat exchanger of claim 1 further comprising a fluid outlet plate coupled to the second layer, wherein the fluid outlet is located in the fluid outlet plate.

4. The jet impingement heat exchanger of claim 1, wherein:
   the target layer comprises a plurality of target layer features having one or more curved walls, and the plurality of target layer microchannels are located between the plurality of target layer features; and
   the second layer comprises a plurality of second layer features having one or more curved walls, and the plurality of second layer microchannels are located between the plurality of second layer features.

5. The jet impingement heat exchanger of claim 4, wherein the curved walls of the target layer features and the second layer features are configured for heat transfer between the coolant fluid and the target layer features and the second layer features.

6. The jet impingement heat exchanger of claim 1, wherein a target layer microchannel pattern that is defined by the plurality of target layer microchannels is different from a second layer microchannel pattern that is defined by the plurality of second layer microchannels.

7. The jet impingement heat exchanger of claim 1, wherein the transition channel is located at a perimeter of the jet impingement heat exchanger between the target layer and the second layer, and is normal to the target layer microchannels and the second layer microchannels.

8. The jet impingement heat exchanger of claim 1, wherein the fluid outlet is concentric with the inlet jet.

9. A power electronics module comprising:
   a jet impingement heat exchanger comprising:
      an inlet jet operable to produce a jet of a coolant fluid;
      a target layer comprising an impingement region and a plurality of target layer microchannels, wherein the target layer microchannels radially extend from the impingement region, the jet of the coolant fluid impinges the target layer at the impingement region, and the coolant fluid flows through the radially-extending target layer microchannels toward a perimeter of the target layer;
      a second layer comprising a plurality of radially-extending second layer microchannels;
      a transition channel positioned between the target layer and the second layer, wherein the transition channel fluidly couples the second layer to the target layer, and the coolant fluid flows through the transition channel and the plurality of radially-extending second layer microchannels; and a fluid outlet fluidly coupled to the second layer and concentric with the inlet jet, wherein the coolant fluid flows from the plurality of radially-extending second layer microchannels though the fluid outlet;

a substrate layer coupled to a backside of the target layer;

a power electronics device coupled to the substrate layer, wherein heat generated by the power electronics device is transferred to the coolant fluid within the jet impingement heat exchanger at least through the substrate layer and the target layer.

10. The power electronics module of claim 9, wherein the inlet jet is substantially cylindrical and is integral with the second layer.

11. The power electronics module of claim 9 further comprising a fluid outlet plate coupled to the second layer, wherein the fluid outlet is located in the fluid outlet plate.

12. The power electronics module of claim 9, wherein:

the target layer comprises a plurality of target layer features having one or more curved walls, and the plurality of target layer microchannels are located between the plurality of target layer features; and the second layer comprises a plurality of second layer features having one or more curved walls, and the plurality of second layer microchannels are located between the plurality of second layer features.

13. The power electronics module of claim 12, wherein the curved walls of the target layer features and the second layer features are configured for heat transfer between the coolant fluid and the target layer features and the second layer features.

14. The power electronics module of claim 9, wherein a target layer microchannel pattern that is defined by the plurality of target layer microchannels is different from a second layer microchannel pattern that is defined by the plurality of second layer microchannels.

15. The power electronics module of claim 9, wherein the transition channel is located at a perimeter of the jet impingement heat exchanger between the target layer and the second layer, and is normal to the target layer microchannels and the second layer microchannels.

16. A jet impingement heat exchanger comprising:

an inlet jet operable to produce a jet of a coolant fluid;

a target layer comprising an impingement region and a plurality of target layer microchannels, wherein the target layer microchannels radially extend from the impingement region, the jet of the coolant fluid impinges the target layer at the impingement region, and the coolant fluid flows through the radially-extending target layer microchannels toward a perimeter of the target layer;

a second layer comprising a plurality of radially-extending second layer microchannels, wherein the inlet jet is integral with the second layer;

a transition channel positioned between the target layer and the second layer at a perimeter of the jet impingement heat exchanger, wherein the transition channel is normal to the target layer microchannels and second layer microchannels, the transition channel fluidly couples the second layer to the target layer, and the coolant fluid flows through the transition channel and the plurality of radially-extending second layer microchannels; and a fluid outlet plate coupled to the second layer, the fluid outlet plate comprising a fluid outlet fluidly coupled to the second layer and concentric with the inlet jet, wherein the coolant fluid flows from the plurality of radially-extending second layer microchannels though the fluid outlet.

17. The jet impingement heat exchanger of claim 16, wherein:

the target layer comprises a plurality of target layer features having one or more curved walls, and the plurality of target layer microchannels are located between the plurality of target layer features; and the second layer comprises a plurality of second layer features having one or more curved walls, and the plurality of second layer microchannels are located between the plurality of second layer features.

18. The jet impingement heat exchanger of claim 17, wherein the curved walls of the target layer features and the second layer features are configured for heat transfer between the coolant fluid and the target layer features and the second layer features.

19. The jet impingement heat exchanger of claim 16, wherein a target layer microchannel pattern that is defined by the plurality of target layer microchannels is different from a second layer microchannel pattern that is defined by the plurality of second layer microchannels.

* * * * *